United States Patent
Otto et al.

(10) Patent No.: US 11,107,944 B2
(45) Date of Patent: Aug. 31, 2021

(54) METHOD OF MANUFACTURING AN OPTOELECTRONIC SEMICONDUCTOR CHIP AND OPTOELECTRONIC SEMICONDUCTOR CHIP

(71) Applicant: OSRAM Opto Semiconductors GmbH, Regensburg (DE)

(72) Inventors: Isabel Otto, Regenstauf (DE); Christian Leirer, Friedberg (DE)

(73) Assignee: OSRAM OTPO GmbH, Regensburg (DE)

( * ) Notice: Subject to any disclaimer, the term of this patent is extended or adjusted under 35 U.S.C. 154(b) by 0 days.

(21) Appl. No.: 16/491,483

(22) PCT Filed: Mar. 21, 2018

(86) PCT No.: PCT/EP2018/057126
§ 371 (c)(1),
(2) Date: Sep. 5, 2019

(87) PCT Pub. No.: WO2018/184842
PCT Pub. Date: Oct. 11, 2018

(65) Prior Publication Data
US 2020/0194612 A1 Jun. 18, 2020

(30) Foreign Application Priority Data

Apr. 4, 2017 (DE) ...................... 10 2017 107 198.9

(51) Int. Cl.
*H01L 31/18* (2006.01)
*H01L 31/0232* (2014.01)
(Continued)

(52) U.S. Cl.
CPC ...... *H01L 31/1892* (2013.01); *H01L 31/0232* (2013.01); *H01L 33/005* (2013.01);
(Continued)

(58) Field of Classification Search
CPC ............ H01L 31/1892; H01L 31/0232; H01L 33/005; H01L 33/405; H01L 33/60; H01L 2933/0016
(Continued)

(56) References Cited

U.S. PATENT DOCUMENTS 8,476,649 B2 * 7/2013 Schubert ................. H01L 33/36
257/88
9,660,163 B2 5/2017 Yang et al.
(Continued)

FOREIGN PATENT DOCUMENTS

DE  10 2007 022 947 A1  10/2008
DE  10 2013 107 531 A1   1/2015
(Continued)

OTHER PUBLICATIONS

Schnitzer, I. et al., "30% external quantum efficiency from surface textured, thin-film light-emitting diodes," *Applied Physics Letters*, 1993, vol. 63, No. 16, pp. 2174-2176.
(Continued)

*Primary Examiner* — Igwe U Anya
(74) *Attorney, Agent, or Firm* — DLA Piper LLP (US)

(57) ABSTRACT

A method of manufacturing an optoelectronic semiconductor chip includes a) providing a semiconductor layer sequence having an active region that generates or receives radiation on a substrate; b) forming at least one recess extending through the active region; c) forming a metallic reinforcement layer on the semiconductor layer sequence by galvanic deposition, the metallic reinforcement layer completely covering the semiconductor layer sequence and at least partially filling the recess; and d) removing the substrate, wherein the metallic reinforcement layer is leveled on a side facing away from the semiconductor layer sequence.

12 Claims, 6 Drawing Sheets

(51) Int. Cl.
   *H01L 33/00* (2010.01)
   *H01L 33/40* (2010.01)
   *H01L 33/60* (2010.01)

(52) U.S. Cl.
   CPC ............ *H01L 33/405* (2013.01); *H01L 33/60* (2013.01); *H01L 2933/0016* (2013.01)

(58) Field of Classification Search
   USPC .......................................................... 257/79
   See application file for complete search history.

(56) References Cited

U.S. PATENT DOCUMENTS

| | | |
|---|---|---|
| 10,014,444 B2 | 7/2018 | Engl et al. |
| 2005/0281303 A1 | 12/2005 | Horio et al. |
| 2006/0065905 A1* | 3/2006 | Eisert ...................... H01L 24/95 257/95 |
| 2009/0065800 A1* | 3/2009 | Wirth .............. H01L 31/022408 257/100 |
| 2010/0171135 A1* | 7/2010 | Engl ........................ H01L 33/58 257/98 |
| 2012/0175764 A1* | 7/2012 | Behammer .......... H01L 23/481 257/706 |
| 2013/0221398 A1 | 8/2013 | Kim et al. |
| 2014/0087499 A1* | 3/2014 | Doan ..................... B82Y 20/00 438/28 |
| 2016/0093769 A1 | 3/2016 | vom Dorp et al. |
| 2017/0330981 A1 | 11/2017 | Hoeppel et al. |
| 2018/0254386 A1 | 9/2018 | Perzlmaier et al. |
| 2019/0019921 A1* | 1/2019 | Hoppel ................ H01L 33/405 |

FOREIGN PATENT DOCUMENTS

| | | |
|---|---|---|
| DE | 10 2014 116 935 A1 | 5/2016 |
| DE | 10 2015 114 587 A1 | 3/2017 |
| JP | 2008-205005 A | 9/2008 |
| KR | 2012-0138725 A | 12/2012 |
| WO | 2014/195420 A1 | 12/2014 |

OTHER PUBLICATIONS

Office Action dated Dec. 17, 2020, of counterpart Korean Application No. 10-2019-7032671, along with an English translation.

Korean Office Action dated Apr. 23, 2021, of counterpart Korean Application No. 10-2019-7032671, along with an English translation.

Notice of Final Rejection dated Mar. 19, 2021, of counterpart Korean Application No. 10-2019-7032671, along with an English translation.

\* cited by examiner

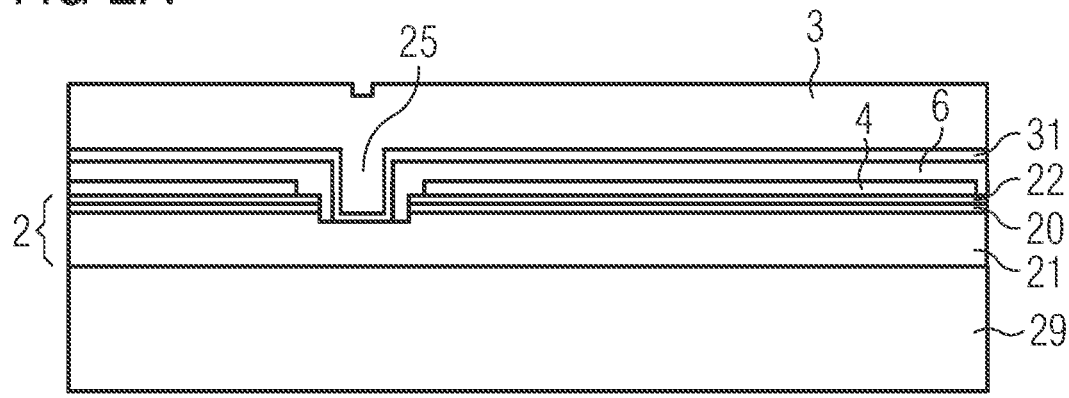
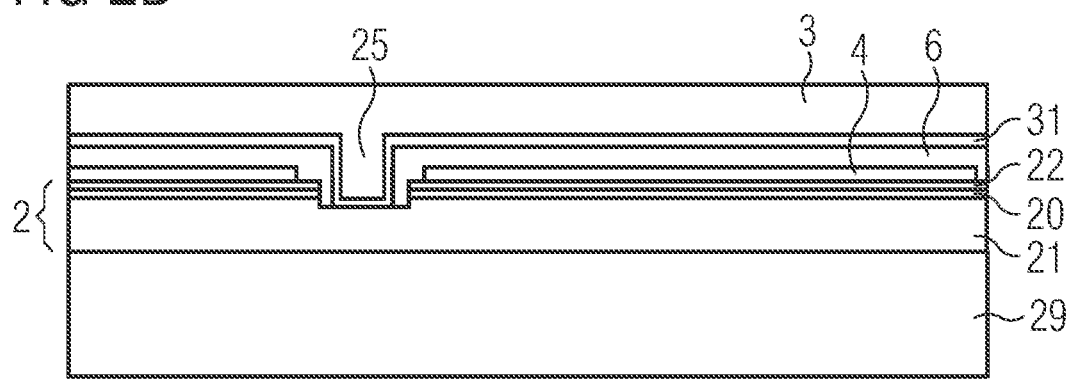
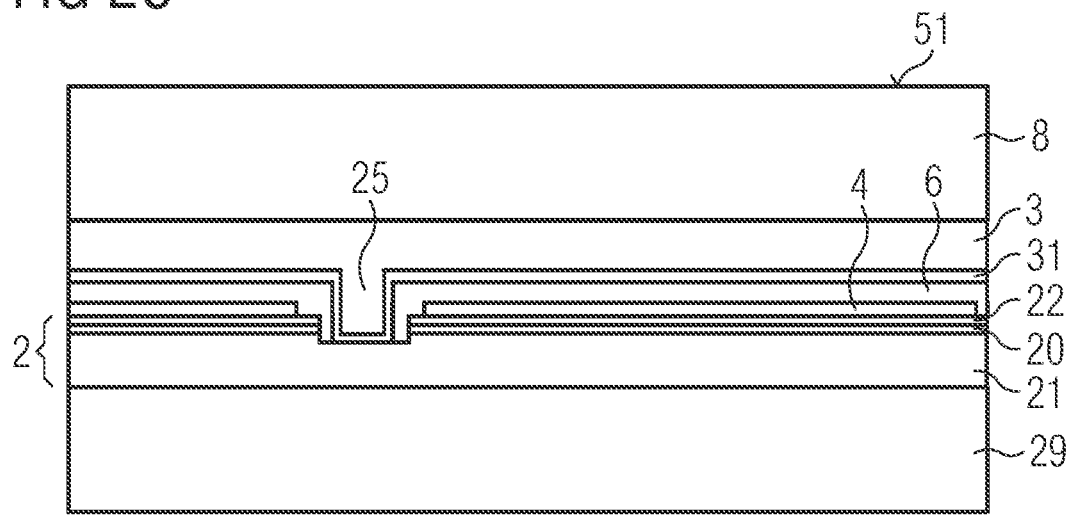

METHOD OF MANUFACTURING AN OPTOELECTRONIC SEMICONDUCTOR CHIP AND OPTOELECTRONIC SEMICONDUCTOR CHIP

TECHNICAL FIELD

This disclosure relates to a method of manufacturing an optoelectronic semiconductor chip and an optoelectronic semiconductor chip.

BACKGROUND

For the manufacture of thin-film semiconductor chips such as thin-film luminescence diode chips, the epitaxial semiconductor layer sequence can be transferred from a growth substrate to a replacement carrier. Typically, a bonding process is used for this purpose, in which the replacement carrier and the semiconductor layer sequence are joined together in a mechanically stable manner.

It could therefore be helpful to provide a method by which optoelectronic semiconductor chips can be manufactured simply and reliably and that are characterized by good optoelectronic properties and a long service life.

SUMMARY

We provide a method of manufacturing an optoelectronic semiconductor chip including
a) providing a semiconductor layer sequence having an active region that generates or receives radiation on a substrate;
b) forming at least one recess extending through the active region;
c) forming a metallic reinforcement layer on the semiconductor layer sequence by galvanic deposition, the metallic reinforcement layer completely covering the semiconductor layer sequence and at least partially filling the recess; and
d) removing the substrate, wherein the metallic reinforcement layer is leveled on a side facing away from the semiconductor layer sequence.

We also provide an optoelectronic semiconductor chip including a semiconductor body including a semiconductor layer sequence having an active region that generates or receives radiation; at least one recess extending through the active region; a metallic reinforcement layer completely covering the semiconductor layer sequence and at least partially filling the recess; wherein the semiconductor chip is free of a growth substrate of the semiconductor layer sequence, and (i) the metallic reinforcement layer forms a carrier of the semiconductor chip or (ii) a carrier is arranged on a side of the metallic reinforcement layer facing away from the semiconductor body, and the metallic reinforcement layer is leveled on a side facing away from the semiconductor layer sequence.

BRIEF DESCRIPTION OF THE DRAWINGS

FIGS. 2A to 2D show an example of a method of manufacturing a semiconductor chip by schematically represented intermediate steps in a sectional view.

Figure 1A:
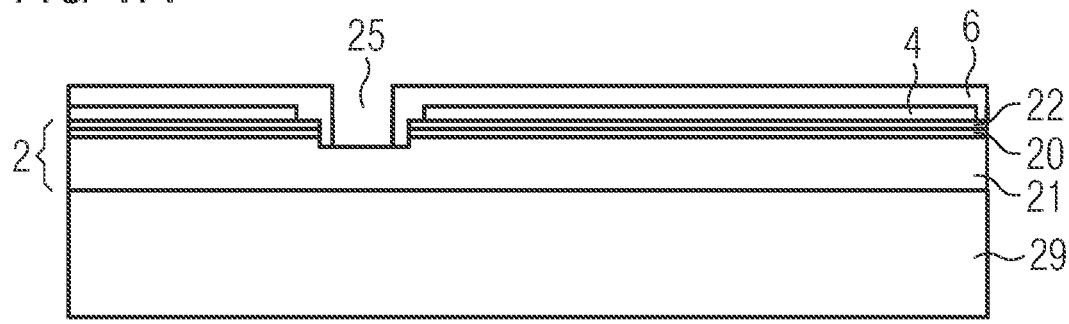
FIGS. 1A to 1F show an example of a method of manufacturing a semiconductor chip by schematically represented intermediate steps in a sectional view (FIGS. 1A to 1E) and in a plan view in FIG. 1F.

LIST OF REFERENCE SIGNS 1 semiconductor chip
10 radiation transmission surface
2 semiconductor layer sequence
20 active region
21 first semiconductor layer
22 second semiconductor layer
25 recess
251 inner recess
252 circumferential recess
27 roughening
28 semiconductor body
29 substrate
3 metallic reinforcement layer
31 seed layer
35 electrical connection
4 connection layer
51 first contact
52 second contact
6 insulation layer
7 mirror layer
8 carrier

DETAILED DESCRIPTION

In our method, a semiconductor layer sequence having an active region that generates or receives radiation may be provided, for example, on a substrate. The substrate is, for example, a growth substrate for an epitaxial deposition of the semiconductor layers of the semiconductor layer sequence or an auxiliary carrier different from the growth substrate, for example, by MOCVD or MBE. For example, the semiconductor layer sequence comprises a first semiconductor layer of a first conductivity type and a second semiconductor layer of a second conductivity type different from the first conductivity type, the active region being arranged between the first semiconductor layer and the second semiconductor layer. The active region may thus be located in a pn junction.

The first semiconductor layer, the second semiconductor layer and the active region can each be single-layered or multi-layered. The active region, for example, is intended to generate and/or receive radiation in the ultraviolet, visible or infrared spectral range.

The method may comprise a step of forming a recess extending through the active region. When the recess is formed, material of the semiconductor layer sequence is removed, for example, by wet chemical or dry chemical etching. For example, the at least one recess extends through the second semiconductor layer and the active region. For example, the recess ends in the first semiconductor layer or completely penetrates the first semiconductor layer.

The method may comprise a step of forming a metallic reinforcement layer on the semiconductor layer sequence. For example, the metallic reinforcement layer is formed by galvanic deposition. Galvanic deposition is particularly suitable for comparatively large layer thicknesses since galvanic deposition is characterized by significantly higher deposition rates than, for example, a method such as vapor deposition or sputtering. Furthermore, the at least one recess can be reliably filled by a galvanic method.

The metallic reinforcement layer, for example, is so thick that it is self-supporting. In particular, the metallic reinforcement layer is so thick that it can carry at least its own weight and, for example, also the weight of the semiconductor layer sequence.

In the vertical direction, i.e. perpendicular to a main extension plane of the active region, a layer thickness of the metallic reinforcement layer is, for example, at least 3 µm, at least 5 µm, at least 10 µm or at least 100 µm.

The metallic reinforcement layer may completely cover the semiconductor layer sequence. The metallic reinforcement layer may thus be formed such that the semiconductor layer sequence is completely covered. A structuring of the metallic reinforcement layer in the lateral direction is therefore not necessary.

The metallic reinforcement layer may at least partially fill the recess. Seen in a vertical direction, i.e. perpendicular to a main extension plane of the semiconductor layers of the semiconductor layer sequence, the metallic reinforcement layer may thus extend at least partially into the recess. In particular, the recess may be completely filled with solid matter after formation of the metallic reinforcement layer.

The method may comprise a step of removing the substrate. Removal of the substrate may take place especially after formation of the metallic reinforcement layer. The semiconductor layer sequence can be mechanically stabilized by the metallic reinforcement layer so that the substrate is no longer required and can therefore be removed.

A semiconductor layer sequence having an active region that generates or receives radiation may be provided on a substrate for manufacturing an optoelectronic semiconductor chip. At least one recess extending through the active region may be formed. A metallic reinforcement layer may be formed on the semiconductor layer sequence by galvanic deposition, the metallic reinforcement layer completely covering the semiconductor layer sequence and at least partially filling the recess. The substrate may be removed.

The metallic reinforcement layer can thus fulfill the function of a carrier that mechanically stabilizes the semiconductor layer sequence. A re-bonding of the semiconductor layer sequence to a replacement carrier is therefore not necessary, but can be carried out additionally. For the metallic reinforcement layer, there is a wide choice of material. For example, nickel, gold, copper, palladium, rhodium or silver are suitable for galvanic deposition. The metallic reinforcement layer itself can also be multi-layered.

In a galvanic deposition, the process parameters can be used to selectively adjust the tension of the metallic reinforcement layer. Mechanical tensions in the semiconductor chip, for example, due to different thermal expansion coefficients between the semiconductor layer sequence and the carrier, can thus be counteracted. For example, the tension is adjusted via the components of the electrolyte for the galvanic deposition, the pH value, the additives added, the speed, the flow, the current intensity, the temporal course of the current intensity, for example, in ramp form or the temperature.

Furthermore, galvanic deposition is characterized by a low material requirement since only as much material has to be deposited as is actually required for the metallic reinforcement layer.

A seed layer may be formed prior to forming the metallic reinforcement layer. For example, the seed layer is formed by vapor deposition or sputtering on the semiconductor layer sequence. The seed layer is in particular electrically conductive. For example, the seed layer is formed over the entire surface of the semiconductor layer sequence.

For example, the seed layer is formed as a mirror layer that reflects the radiation to be generated or received by the active region. Alternatively, a mirror layer can be applied to the semiconductor layer sequence prior to formation of the seed layer. In both examples, the reflectivity of the mirror layer for a peak wavelength of the radiation to be generated or received in the active region is at least 60%, preferably at least 80%.

By the mirror layer, during operation of the optoelectronic semiconductor chip, radiation components running in the direction of the metallic reinforcement layer can be reflected by the mirror layer.

A vertical extension of the metallic reinforcement layer may be at least 5 µm or at least 10 µm. For example, the vertical extension of the metallic reinforcement layer may be at least as large as the vertical extension of the semiconductor layer sequence. For example, the vertical extension is at most 200 µm or at most 150 µm.

The metallic reinforcement layer may form a carrier of the semiconductor chip that mechanically stabilizes the semiconductor layer sequence. For example, a vertical extension of the metallic reinforcement layer is 50 µm to 200 µm, in particular 100 µm to 150 µm.

For example, the vertical extension of the metallic reinforcement layer is at least 60% or at least 80% of the total vertical extension of the semiconductor chip.

After the metallic reinforcement layer has been formed, a carrier may be attached to the side of the metallic reinforcement layer facing away from the semiconductor layer sequence. The carrier is electrically conductive, for example. For example, the carrier contains a metal or consists of a metal. Alternatively, the carrier may contain a semiconductor material or consist of a semiconductor material. Thus, the carrier alone or at least together with the metallic reinforcement layer can cause a mechanical stabilization of the semiconductor layer sequence.

The carrier may be attached to the metallic reinforcement layer by a direct bond. With a direct bond connection, the mechanically stable connection is usually achieved by the action of pressure and/or heat. A direct bond connection is made, for example, by van der Waals bonds or hydrogen bonds. A separate joining layer such as an adhesive layer or a solder layer is not required for formation of a direct bond.

The metallic reinforcement layer may be leveled on a side facing away from the semiconductor layer sequence. For example, the metallic reinforcement layer is exposed to a chemomechanical polishing process. Unevenness of the metallic reinforcement layer, for example, due to the recess to be filled, can thus be compensated. In particular, the metallic reinforcement layer can be levelled before the carrier is attached to the metallic reinforcement layer by a direct bond. This increases the reliability of the direct bond connection.

The semiconductor chip produced by the manufacturing method comprises a semiconductor body comprising part of the semiconductor layer sequence.

The at least one recess may be an inner recess completely surrounded by material of the semiconductor body in the lateral direction. A semiconductor body may have one or more such recesses.

At least one recess may be a circumferential recess running around the semiconductor body at least in places in the lateral direction.

In the manufacture of the semiconductor chip, the circumferential recess between two semiconductor chips to be manufactured side by side can form a separation trench that separates the individual semiconductor bodies from each other in the lateral direction. With the method, only one or more inner recesses, only one circumferential recess or both one or more inner recesses and one circumferential recess can be formed for each semiconductor body. The at least one inner recess and the circumferential recess may be formed in a common manufacturing step or in two different manufacturing steps.

The semiconductor body may be formed after formation of the metallic reinforcement layer and after removal of the substrate. For example, the semiconductor layer sequence is removed in places from a side facing away from the metallic reinforcement layer to form a separation trench.

The metallic reinforcement layer may be electrically insulated from the semiconductor body in the circumferential recess. Hence, in the area of the circumferential recess, the metallic reinforcement layer need not electrically contact the semiconductor body.

The metallic reinforcement layer may electrically contact the semiconductor body in the circumferential recess. For example, the metallic reinforcement layer or the seed layer adjoins the first semiconductor layer. The metallic reinforcement layer thus forms an electrical connection to the semiconductor body, especially to the first semiconductor layer, in the form of a frame running around the semiconductor body. Electrical contacting via inner recesses can also take place, but is not absolutely necessary.

Our optoelectronic semiconductor chip comprises, in at least one example, a semiconductor body comprising a semiconductor layer sequence, the semiconductor layer sequence having an active region that generates or receives radiation. The semiconductor chip has at least one recess extending through the active region. The semiconductor chip comprises a metallic reinforcement layer that completely covers the semiconductor layer sequence and at least partially fills the recess. The semiconductor chip is free of a growth substrate of the semiconductor layer sequence. For example, the metallic reinforcement layer forms a carrier of the semiconductor chip or a carrier is arranged on a side of the metallic reinforcement layer facing away from the semiconductor body.

The method described above is particularly suitable for manufacturing the semiconductor chip. Features mentioned in connection with the method can therefore also be used for the semiconductor chip and vice versa.

Further designs and functionalities can be derived from the following description of examples in connection with the figures.

Identical, similar or equivalent elements are provided with the same reference signs in the figures.

The figures are schematic representations and therefore not necessarily true to scale. Rather, comparatively small elements and, in particular, layer thicknesses can be displayed exaggeratedly large for clarification.

Figure 1B:
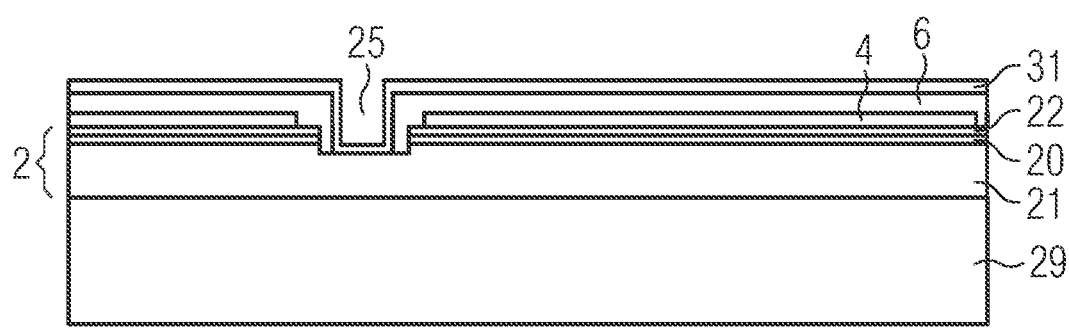
Figure 1C:
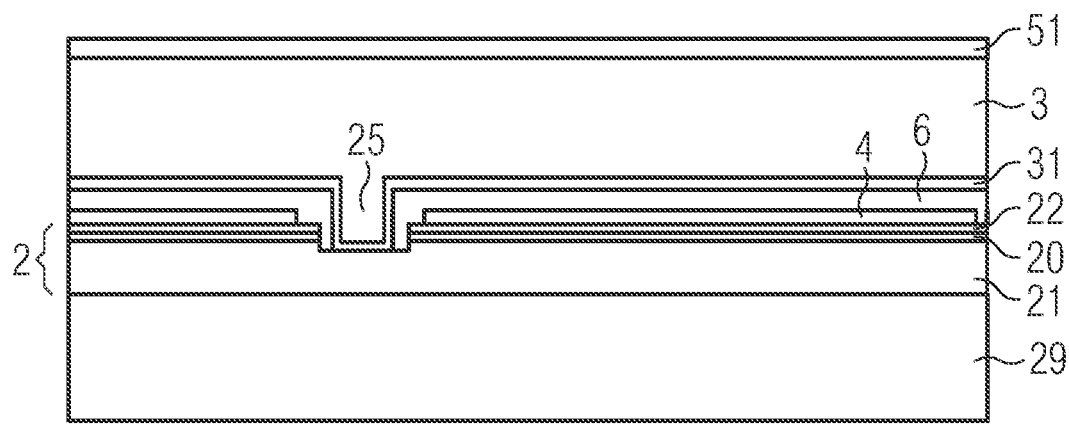
Figure 1D:
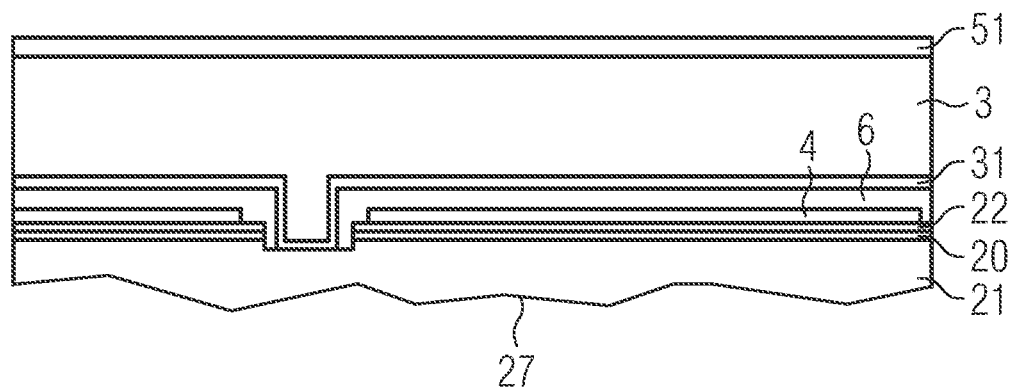
Figure 1E:
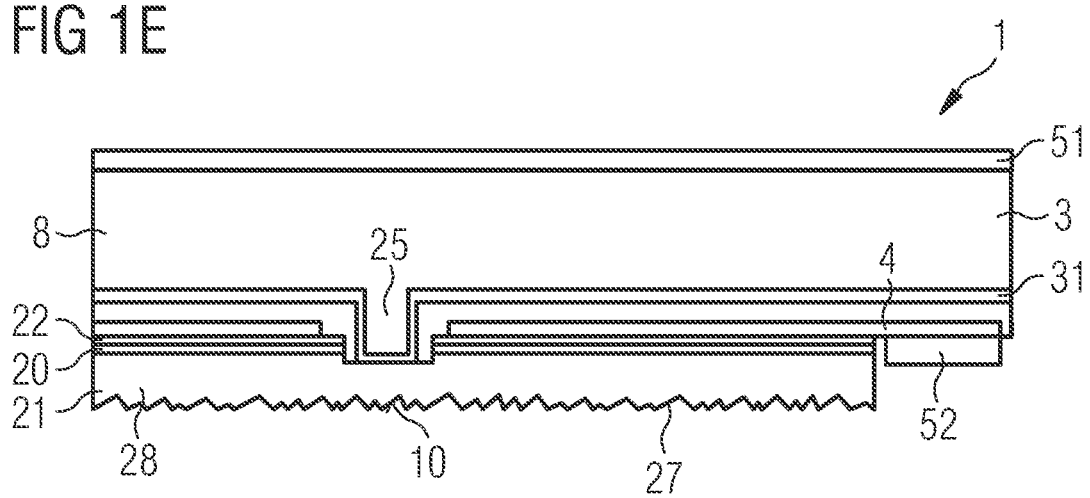
Figure 1F:
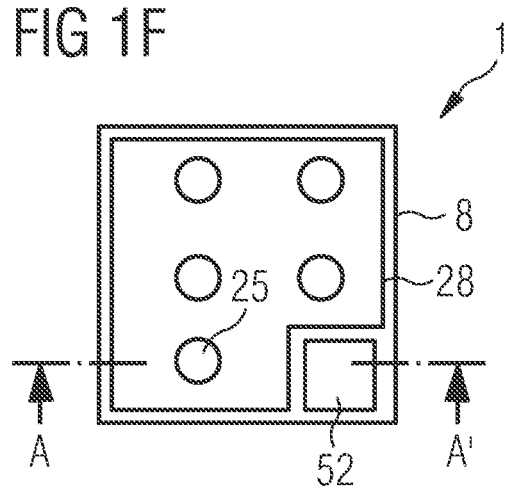
Figure 2D:
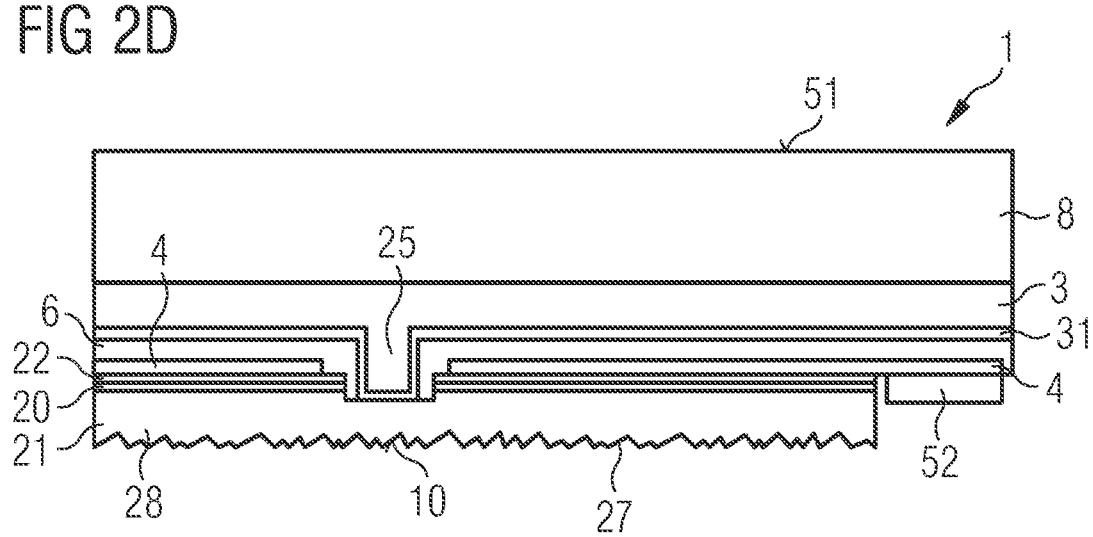

FIGS. 1A to 1F show an example of a method of manufacturing a semiconductor chip, FIG. 1E shows a section of a finished semiconductor chip in a sectional view along the AA' line shown in the plan view in FIG. 1F.

For the sake of simplicity, the figures only show a section of the semiconductor layer sequence 2 from which an optoelectronic semiconductor chip is produced during the method. Typically, a large number of optoelectronic semiconductor chips are produced simultaneously in a composite. During separation of the composite, the semiconductor chips are formed, wherein for each separated semiconductor chip a semiconductor body is formed from the semiconductor layer sequence 2.

A semiconductor layer sequence 2 having an active region 20 that generates radiation or receives radiation is provided on a substrate 29 (FIG. 1A). For example, the substrate 29 is a growth substrate for production of the semiconductor layer sequence 2 using an epitaxial process such as MOCVD or MBE.

The active region 20 is arranged between a first semiconductor layer 21 of a first conductivity type such as n-type, and a second semiconductor layer 22 of a second conductivity type such as p-type, different from the first conductivity type. The active region 20, the first semiconductor layer 21 and the second semiconductor layer 22 can each be multi-layered. Details of these layers are not shown for a simplified representation.

In the semiconductor layer sequence 2, a recess 25 is formed that extends through the active region 20. The recess 25 penetrates in particular the second semiconductor layer 22 and the active region 20 and ends in the first semiconductor layer 21. For example, the recess is formed by a wet-chemical or dry-chemical etching process.

At least the side surfaces of the recess 25 are partially covered by an insulation layer 6 such as a dielectric oxide layer or a nitride layer. For later electrical contacting, an opening is formed in the insulation layer 6 in the area of the recess 25, the first semiconductor layer 21 being exposed in the opening.

Deviating from this, the insulation layer 6 may also be subjected to an anisotropic etch back process so that the insulation layer 6 is removed on horizontal surfaces substantially parallel to a main extension plane of the semiconductor layers of the semiconductor layer sequence, while vertical or substantially vertical surfaces such as side surfaces of the recesses 25 remain coated. Especially in comparison to formation of an opening in the insulation layer by a photolithographic method, the lateral extension of the recess 25 and thus the surface loss for the active region 20 can thus be minimized.

A connection layer 4 is arranged on the semiconductor layer sequence 2. The connection layer 4 is provided for electrical contacting of the second semiconductor layer 22. Furthermore, an insulation layer 6 is arranged on the semiconductor layer sequence 2, which completely covers the connection layer 4 and also covers the side surfaces of the recesses 25 at least at the level of the active region 20.

As shown in FIG. 1B, a seed layer 31 is formed on the semiconductor layer sequence 2. The seed layer 31 can be formed over the entire surface so that a structuring of the seed layer or a structured application of the seed layer is not necessary. In the recess 25, the seed layer 31 adjoins the first semiconductor layer 21. For example, the seed layer 31 is formed as a mirror layer for the radiation to be generated or received in the active region 20 during operation. For example, the seed layer 31 contains a material with a high reflectivity in the ultraviolet, visible and/or infrared spectral range such as silver, nickel, palladium, rhodium, chromium or gold.

In principle, however, another electrically conductive material such as copper is also suitable for the seed layer 31. The seed layer 31 can also be multi-layered.

A metallic reinforcement layer 3 is subsequently applied to the unstructured seed layer 31 (FIG. 1C). The metallic reinforcement layer is deposited in particular by a galvanic method. For example, the metallic reinforcement layer contains nickel, gold or copper or another metal. The metallic reinforcement layer 3 can also be multi-layered, for example, with a gold layer facing the semiconductor layer sequence and a nickel layer arranged on the side of the gold layer facing away from the semiconductor layer sequence 2. For example, in a multi-layer formation of the metallic reinforcement layer, a thickness of the layer closest to the semiconductor layer sequence such as the gold layer is at most 50% or at most 10% of the thickness of a subsequent partial layer of the metallic reinforcement layer.

The metallic reinforcement layer 3 is formed so thick that it is self-supporting and can mechanically stabilize the semiconductor layer sequence 2 even in the absence of the substrate 29. For example, a thickness of the metallic reinforcement layer is 5 µm to 200 µm, approximately 100 µm to 150 µm.

The metallic reinforcement layer 3 can be formed such that tensions, for example, due to different thermal expansion coefficients, for example, compared to the semiconductor layer sequence 2, are at least partially compensated for. The tension can be adjusted during the galvanic deposition of the metallic reinforcement layer 3, for example, by suitable parameters of the electrolyte such as its constituents, additives, pH value, speed, flow, current intensity, the temporal course of the current intensity, for example, in ramp form, and/or temperature.

In the example shown in FIG. 1C, a first contact 51 is formed on the metallic reinforcement layer 3. Deviating from this, however, a surface of the metallic reinforcement layer 3 facing away from the semiconductor layer sequence 2 can also form the first contact.

Subsequently, as shown in FIG. 1D, the substrate 29 is removed, for example, using a laser lift-off (LLO) method, a mechanical method and/or a chemical method.

A semiconductor chip in which the growth substrate is removed is also referred to as a thin-film semiconductor chip.

A thin-film semiconductor chip such as a thin-film light-emitting diode chip may also be characterized by at least one of the following distinguishing features:
on a first main surface of the semiconductor body 28 facing towards a carrier element, for example, the metallic reinforcement layer 3, and which comprises the semiconductor layer sequence 2 with the active region 20, a mirror layer is applied or is formed, for example, integrated as a Bragg mirror in the semiconductor layer sequence, which reflects at least some of the radiation produced or to be detected in the semiconductor layer sequence back into the semiconductor layer sequence; the semiconductor layer sequence 2 has a thickness of 20 µm or less, in particular 3 µm to 10 µm, about 5 µm; and/or
the semiconductor layer sequence 2 contains at least one semiconductor layer having at least one surface having a mixing structure that ideally leads to an approximately ergodic distribution of the light in the semiconductor layer sequence, i.e. it has a stochastic scattering behavior which is as ergodic as possible.

A basic principle of a thin-film light-emitting diode chip is described, for example, in I. Schnitzer et al., Appl. Phys. Lett. 63 (16), 18 Oct. 1993, 2174-2176, the subject matter of which is incorporated herein by reference.

The first semiconductor layer 21 of the semiconductor layer sequence 2 exposed in this way forms a radiation transmission surface 10 of the semiconductor chip to be produced. After removing the substrate 29, this surface can be provided with a roughening 27, for example, by a wet chemical etching process.

After removing the substrate 29, a semiconductor body 28 can be formed from the semiconductor layer sequence 2 for each semiconductor chip 1 to be manufactured. A finished semiconductor chip 1 produced by separation from a wafer composite is shown in FIG. 1E in a sectional view along the AA' line of the top view of the semiconductor chip shown in FIG. 1F.

The individual semiconductor bodies 28 are thus formed from the semiconductor layer sequence 2 after the metallic reinforcement layer has been applied. The metallic reinforcement layer 3 fulfils the function of a carrier for the semiconductor layer sequence of the semiconductor body 28. A re-bonding process in which the semiconductor layer sequence 2 is transferred to a prefabricated carrier can therefore be dispensed with.

Apart from the total thickness of semiconductor layer sequence 2, which is typically only a few micrometers, the vertical extension of the semiconductor chip 1 is essentially the same as the vertical extension of the metallic reinforcement layer 3. For example, the vertical extension of the reinforcement layer is at least 70% or at least 80% of the total vertical extension of semiconductor chip 1.

The semiconductor chip 1 has a second contact 52 electrically connected to the second semiconductor layer 22. For example, the second contact 52 is a layer deposited on an exposed area of the connection layer 4 or an exposed surface of the connection layer 4. The second contact 52 is located on the side of the semiconductor body. The radiation transmission surface 10 of the semiconductor body 28 is therefore free of an external electrical contact that could cause shading. The first contact 51 and the second contact 52 are arranged especially on opposite sides of the metallic reinforcement layer 3. The semiconductor chip can be electrically contacted externally via the first contact 51 and the second contact 52.

Furthermore, the semiconductor body 28 can be covered with a passivation layer on the side facing away from the metallic reinforcement layer 3 (not explicitly shown).

The semiconductor chip 1 is characterized by a particularly efficient heat dissipation of heat loss generated during operation. High efficiency even at high operating currents can thus be achieved in a simplified manner. Furthermore, the metallic reinforcement layer 3 can cause a particularly insensitive and efficient encapsulation of the semiconductor chip on the side facing away from the radiation transmission surface 10. A long service life of the semiconductor chip is promoted.

A further example is shown in FIGS. 2A to 2D in a schematic sectional view. This example essentially corresponds to the example described in connection with FIGS. 1A to 1F. In particular, the semiconductor layer sequence 2 and the layers deposited on the semiconductor layer sequence 2 may be formed at the intermediate stage shown in FIG. 2A as described in connection with FIG. 1A.

After the metallic reinforcement layer 3 has been applied, it is levelled by material removal such as chemomechanical polishing. Unevenness in the metallic reinforcement layer 3, for example, due to the recess 25 to be filled can thus be compensated so that the metallic reinforcement layer 3 is even on the side facing away from the semiconductor layer sequence. Subsequently, a carrier 8 is applied to the metallic reinforcement layer 3. This is done in particular by a material bond connection.

In a material bond connection, the preferably prefabricated connecting partners are held together by atomic and/or molecular forces. A material bond can be achieved, for example, by a joining layer such as an adhesive layer or a solder layer. As a rule, disconnection of the bond is accompanied by destruction of the connection means and/or at least one of the connection partners.

In particular, a direct bond connection can be used. In a direct bond connection, the mechanical connection is established in particular exclusively under the influence of pressure and/or heat. A joining layer such as a solder layer or an adhesive layer is not required for a direct bond. In particular, a direct bond can be made via van der Waals forces or hydrogen bonds.

The carrier 8 is expediently designed to be electrically conductive. For example, the carrier contains a metal or consists of a metal such as copper, aluminum or molybdenum, or an especially doped semiconductor material such as silicon or germanium. A surface of the carrier 8 facing away from the semiconductor layer sequence 2 serves as the first contact 51. Alternatively, like in the first example, a separate layer can form the first contact. The subsequent steps, in particular removing the substrate, forming the semiconductor bodies from the semiconductor layer sequence and forming a second contact, may be performed as described in connection with FIGS. 1D to 1F.

In this example, the metallic reinforcement layer 3 together with the carrier 8 forms the element mechanically supporting the semiconductor layer sequence of the semiconductor body 28. In this example, the metallic reinforcement layer can therefore be thinner and, for example, have a layer thickness of at least 5 µm.

The example shown in FIGS. 3A to 3C essentially corresponds to the example described in connection with FIGS. 1A to 1F.

Figure 3A:
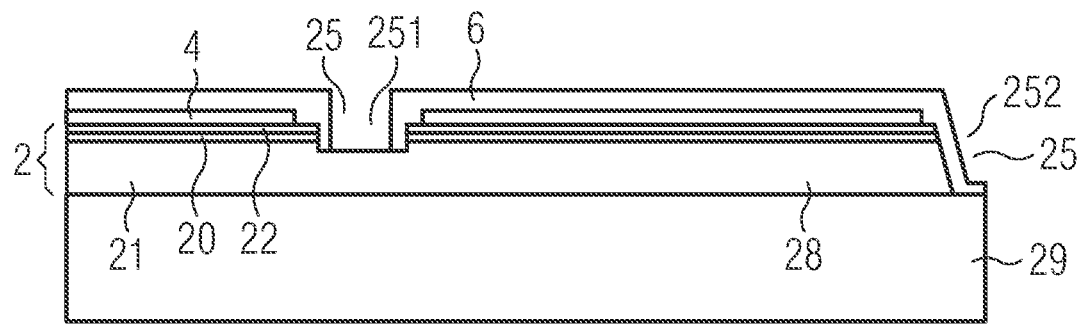
FIGS. 3A to 3C show an example of a method of manufacturing a semiconductor chip by schematically represented intermediate steps in a sectional view.
Figure 3B:
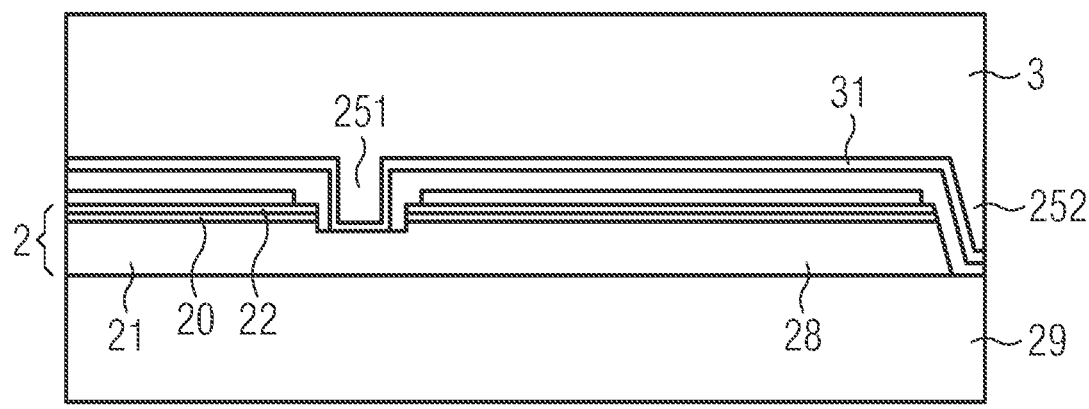
Figure 3C:
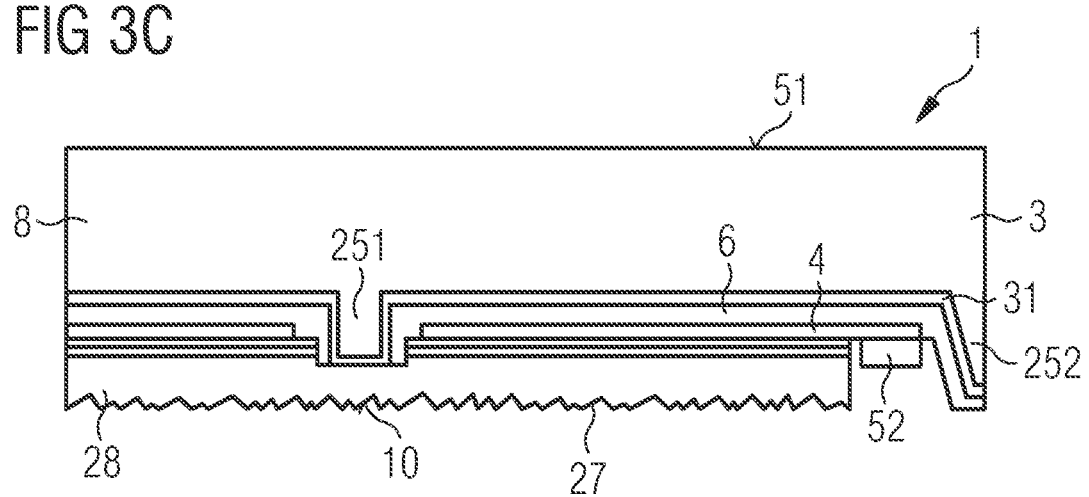

In contrast, as shown in FIG. 3A, a plurality of recesses 25 are formed from the side facing away from the substrate 28. An inner recess 251 corresponds to the recess 25 shown in FIG. 1A. In addition, a circumferential recess 552 is formed which also extends through at least the second semiconductor layer 22 and the active region 20. In this example, the semiconductor bodies 28 of the semiconductor chips to be manufactured are formed from the semiconductor layer sequence 2 before the metallic reinforcement layer 3 is formed.

A seed layer 31 is formed over the entire surface of the semiconductor layer sequence 2. Subsequently, a metallic reinforcement layer 3 is applied over the entire surface. The metallic reinforcement layer fills the inner recess 251 and the circumferential recess 252. In the inner recess 251, the seed layer and the metallic reinforcement layer electrically conductively connect to the first semiconductor layer 21. These layers are electrically insulated from the first semiconductor layer 21 in the circumferential recess 252 by the insulation layer 6. The metallic reinforcement layer 3 extends at least in places along the circumference of the semiconductor body 28 of a semiconductor chip to be manufactured at the level of the active region 20.

After forming the metallic reinforcement layer 3, the further manufacturing steps can be carried out as described in connection with FIGS. 1D to 1F, in particular removing the substrate 29, forming the roughening 27, and forming a second contact 52.

The circumferential recess 252 need not necessarily extend through the entire semiconductor layer sequence 2 in the intermediate step shown in FIG. 3A. Alternatively, it is also possible that the circumferential recess 252 extends in the vertical direction only partially through the semiconductor layer sequence 2 and material of the semiconductor layer sequence 2 is removed in the region of the circumferential recess when the roughening 27 is formed.

The metallic reinforcement layer 3 forms a metallic encapsulation of the semiconductor body to be produced, the metallic reinforcement layer covering the surface of the semiconductor layer sequence 2 facing away from the substrate and the side surfaces of the semiconductor body 28 completely or at least at the level of the active region 20. Of course, a carrier 8 can also be applied to the metallic reinforcement layer 3 in this example of the manufacturing method, especially as described in connection with FIG. 2C.

Figure 4A:
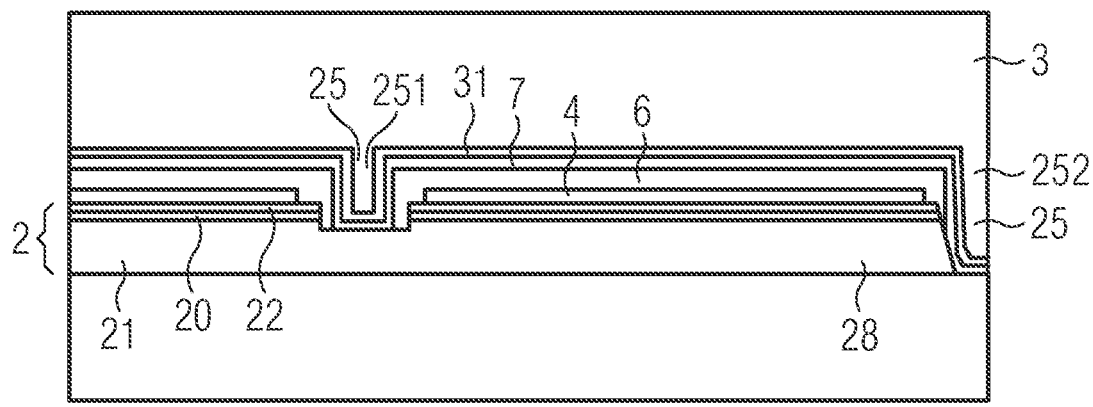
FIGS. 4A to 4C show an example of a method of manufacturing a semiconductor chip by schematically represented intermediate steps in a sectional view (FIGS. 4A and 4B) and in a plan view (FIG. 4C).
Figure 4B:
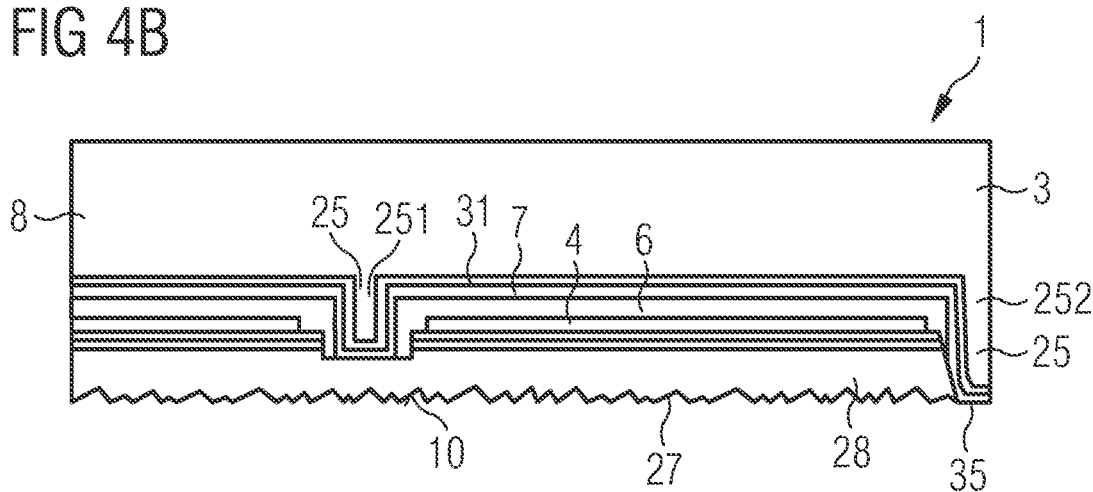
Figure 4C:
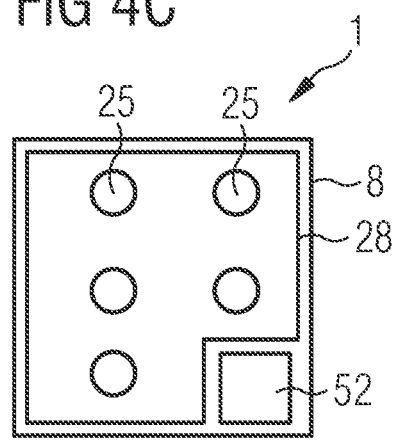

FIGS. 4A to 4C show another example of a method of manufacturing a semiconductor chip. This example essentially corresponds to the example described in connection with FIGS. 3A to 3C.

In contrast, the seed layer 31 is provided in addition to a mirror layer 7. The mirror layer 7 is located between the seed layer 31 and the semiconductor layer sequence 2. In this example, the material for the seed layer can be selected independently of the reflectivity of the material. The mirror layer 7 itself can also be multi-layered and can, for example, have a metallic layer and a layer containing a TCO material (TCO: transparent conductive oxide).

Of course, such an additional mirror layer can also be used in the previous examples or be omitted in this example.

Furthermore, the metallic reinforcement layer 3 and the seed layer 31 electrically conductively connect to the first semiconductor layer 21 in the area of the circumferential recess 252.

The metallic reinforcement layer 3 thus forms an electrical connection 35 running at least in places along a circumference of the semiconductor body 28. In other words, the semiconductor body 28 is electrically contacted in the form of a frame along its circumference.

Deviating from the example shown, depending on the transverse conductivity of the first semiconductor layer 21 and the lateral extension of the semiconductor body 28, the inner recesses 251 can also be dispensed with so that the circumferential recess 252 is the only recess introduced into the semiconductor layer sequence 2 from the side of the semiconductor layer sequence 2 facing away from the substrate 28.

Our methods and chips are not limited by the description of the examples. Rather, this disclosure includes any new feature and any combination of features, which in particular includes any combination of features in the appended claims, even if the feature or combination itself is not explicitly mentioned in the claims or the examples.

This application claims priority of DE 10 2017 107 198.9, the subject matter of which is incorporated herein by reference.

The invention claimed is:

1. A method of manufacturing an optoelectronic semiconductor chip comprising:
   a) providing a semiconductor layer sequence having an active region that generates or receives radiation on a substrate;
   b) forming at least one recess extending through the active region;
   c) forming a metallic reinforcement layer on the semiconductor layer sequence by galvanic deposition, said metallic reinforcement layer completely covering the semiconductor layer sequence and at least partially filling the recess; and
   d) removing the substrate, wherein the metallic reinforcement layer is leveled on a side facing away from the semiconductor layer sequence, wherein
   a first semiconductor layer of the semiconductor layer sequence is exposed by the at least one recess and a seed layer is formed prior to forming the metallic reinforcement layer, said seed layer abuts the first semiconductor layer in the at least one recess, and the seed layer is configured to be electrically conductive.

2. The method according to claim 1, wherein the seed layer is formed as a mirror layer or a mirror layer is applied to the semiconductor layer sequence prior to forming the seed layer.

3. The method according to claim 1, wherein the metallic reinforcement layer forms a carrier of the semiconductor chip which mechanically stabilizes the semiconductor layer sequence.

4. The method according to claim 1, wherein a carrier is attached on the side of the metallic reinforcement layer facing away from the semiconductor layer sequence after c).

5. The method according to claim 4, wherein the carrier is attached to the metallic reinforcement layer by a direct bond.

6. The method according to claim 1, wherein the semiconductor chip comprises a semiconductor body comprising the semiconductor layer sequence.

7. The method according to claim 6, wherein the at least one recess is an inner recess completely surrounded by material of the semiconductor body in the lateral direction.

8. The method according to claim 6, wherein the at least one recess is a circumferential recess running around the semiconductor body at least in places in the lateral direction.

9. The method according to claim 8, wherein the metallic reinforcement layer is electrically insulated from the semiconductor body in the circumferential recess.

10. The method according to claim 8, wherein the metallic reinforcement layer electrically contacts the semiconductor body in the circumferential recess.

11. The method according to claim 6, wherein the semiconductor body is formed from the semiconductor layer sequence after c) and after d).

12. An optoelectronic semiconductor chip comprising:
a semiconductor body comprising a semiconductor layer sequence having an active region that generates or receives radiation;
at least one recess extending through the active region;
a metallic reinforcement layer completely covering the semiconductor layer sequence and at least partially filling the recess;
wherein the semiconductor chip is free of a growth substrate of the semiconductor layer sequence, and (i) the metallic reinforcement layer forms a carrier of the semiconductor chip or (ii) a carrier is arranged on a side of the metallic reinforcement layer facing away from the semiconductor body,
the metallic reinforcement layer is leveled on a side facing away from the semiconductor layer sequence, and
an electrically conductive seed layer abuts a first semiconductor layer of the semiconductor layer sequence in the at least one recess.

* * * * *

UNITED STATES PATENT AND TRADEMARK OFFICE
CERTIFICATE OF CORRECTION

PATENT NO. : 11,107,944 B2
APPLICATION NO. : 16/491483
DATED : August 31, 2021
INVENTOR(S) : Otto et al.

It is certified that error appears in the above-identified patent and that said Letters Patent is hereby corrected as shown below:

On the Title Page

Item (73) change "OSRAM OTPO GmbH" to --OSRAM OLED GmbH--.

Signed and Sealed this
Second Day of August, 2022

Katherine Kelly Vidal
*Director of the United States Patent and Trademark Office*